(12) United States Patent
Matsumoto et al.

(10) Patent No.: US 8,709,541 B2
(45) Date of Patent: Apr. 29, 2014

(54) METHOD FOR FORMING A FILM

(75) Inventors: Kenji Matsumoto, Nirasaki (JP);
Hidenori Miyoshi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/386,307

(22) PCT Filed: Jul. 21, 2010

(86) PCT No.: PCT/JP2010/062242
§ 371 (c)(1),
(2), (4) Date: Jun. 19, 2012

(87) PCT Pub. No.: WO2011/010660
PCT Pub. Date: Jan. 27, 2011

(65) Prior Publication Data
US 2012/0251721 A1    Oct. 4, 2012

(30) Foreign Application Priority Data

Jul. 22, 2009  (JP) ................................. 2009-170837

(51) Int. Cl.
*C23C 16/18* (2006.01)

(52) U.S. Cl.
USPC ............... 427/255.6; 427/255.393; 427/255.7

(58) Field of Classification Search
USPC .............................. 427/255.6, 255.393, 255.7
See application file for complete search history.

(56) References Cited

U.S. PATENT DOCUMENTS

| | | | |
|---|---|---|---|
| 7,344,226 B2 * | 3/2008 | Silverbrook ..................... 347/45 |
| 7,600,856 B2 * | 10/2009 | Lebens et al. ..................... 347/56 |
| 7,984,973 B2 * | 7/2011 | McAvoy et al. ................. 347/56 |
| 8,491,803 B2 * | 7/2013 | McAvoy et al. ................. 216/27 |
| 2004/0089232 A1 * | 5/2004 | Sasaki et al. ................... 118/620 |
| 2007/0194005 A1 * | 8/2007 | Hirakawa et al. .............. 219/403 |
| 2009/0023600 A1 * | 1/2009 | Wagner et al. .................. 506/14 |
| 2011/0228004 A1 * | 9/2011 | Silverbrook ..................... 347/45 |

FOREIGN PATENT DOCUMENTS

| | | | |
|---|---|---|---|
| JP | 2002-266073 | A | 9/2002 |
| JP | 2004-107747 | A | 4/2004 |
| JP | 2004-115899 | A | 4/2004 |
| JP | 2004-311937 | A | 11/2004 |
| JP | 2005-251975 | A | 9/2005 |
| JP | 2005-277390 | A | 10/2006 |
| JP | 2007-501902 | * | 2/2007 |
| JP | 2007-501902 | A | 2/2007 |
| JP | 2007-537360 | A | 12/2007 |
| WO | 2006101171 | A1 | 9/2006 |

OTHER PUBLICATIONS

International Search Report cited in PCT Application No. PCT/JP2010/062242, dated Sep. 21, 2010, four (4) pages.

* cited by examiner

*Primary Examiner* — Bret Chen
(74) *Attorney, Agent, or Firm* — Nath, Goldberg & Meyer; Jerald L. Meyer

(57) ABSTRACT

A method for forming a thin film on a surface of an object to be processed by using an organic metal raw material gas within a processing chamber configured to exhaust air includes: hydrophobizing a surface of the processing chamber by introducing a hydrophobic gas into the processing chamber without the object to be processed accommodated in the processing chamber; and forming the thin film by introducing the organic metal raw material gas into the processing chamber with the object to be processed accommodated in the processing chamber.

3 Claims, 3 Drawing Sheets

METHOD FOR FORMING A FILM

CROSS-REFERENCE TO RELATED APPLICATIONS

This application is a 35 U.S.C. §371 national stage filing of International Application No. PCT/JP2010/062242, filed Jul. 21, 2010, the entire contents of which are incorporated by reference herein, which claims priority to Japanese Patent Application No. 2009-170837, filed Jul. 22, 2009, the entire contents of which are incorporated by reference herein.

TECHNICAL FIELD

The present disclosure relates to a device and method for forming a thin film, such as for example a manganese (Mn)-containing film, as a barrier/seed film on the surface of an object to be processed such as a semiconductor wafer, or the like.

BACKGROUND

In general, in fabricating a semiconductor device, various processes such as film formation, pattern etching, and the like, are repeatedly performed on a semiconductor wafer to fabricate a desired device. As semiconductor devices are required to be highly integrated and fine, a line width or a hole diameter is increasingly reduced. According to one related art, as a material of a wiring or a material to be buried in a recess such as a trench, a hole, or the like, copper, which has very small electric resistance and is low-priced, tends to be used since it is necessary to reduce electric resistance due to the reduction in various dimensions. Also, when copper is used as a wiring material or buried material, a tantalum (Ta), tantalum nitride film (TaN), or the like is generally used as a barrier layer in consideration of diffusion barrier properties, or the like of copper thereunder.

In order to bury copper in the recess, in a plasma sputtering apparatus, a thin seed film formed of a copper film is first formed on the entire surface of the wafer including all the faces of the wall within the recess, and the entire surface of the wafer is then plated with copper. Accordingly, the interior of the recess is totally buried. Thereafter, the remaining copper thin film on the surface of the wafer is polished and removed through chemical mechanical polishing (CMP), or the like.

Recently, various techniques have been developed to further improve the reliability of the barrier layer. Among them, a self-formation barrier layer using a manganese (Mn) film or a copper-manganese (CuMn) alloy film, instead of Ta film or TaN film, has come to prominence in another related art. The Mn film or CuMn alloy film are formed through sputtering, and the Mn film or CuMn alloy film itself is used as a seed film. Thus, a Cu-plated layer may be formed directly at an upper portion of the Mn film or the CuMn alloy film, and after plating the Cu plated layer, annealing may be performed. Then, the Cu-plated layer is reacted with an $SiO_2$ layer, the underlying insulting film, in a manner of self-alignment to form a barrier film called MnSixOy (where x and y are each a certain positive integer) or MnOx (where x is a certain positive integer), a manganese oxide, at the boundary between the SiO2 layer and the Mn film or the CuMn alloy film. Namely, the number of fabrication processes can be reduced.

However, the method of forming the Cu film or the CuMn alloy film through sputtering does not have good coverage, which may fail to sufficiently cope with the trend of fabricating a highly fine semiconductor device. Thus, recently, research for forming these films according to CVD has been conducted. Also, multiple types of manganese oxides such as MnO, $Mn_3O_4$, $Mn_2O_3$, $MnO_2$, or the like exist depending on the degree of Mn, which will be generally referred to as $MnO_x$ in the present specification.

Here, as mentioned above, when forming the Mn film and the CuMn alloy film by using a film forming device, a thermal CVD method is generally used. In this case, however, a great amount of sediment adheres on an inner surface of a processing chamber of the film forming device, on a surface of an inner structure within the processing chamber, and on an inner wall or on a surface of an inner structure of an exhaust pipe reaching a trap of an exhaust system, a pressure regulation valve (APC), a vacuum pump, or the like. As a result, the frequency of a cleaning process is increased or a great amount of particles is generated due to delamination of the sediment. These problems are severe because a film formation rate increases when an oxygen-containing gas such as $H_2O$, or the like is added as a reactant gas.

SUMMARY

The present disclosure provides a device and method for forming a film capable of restraining sediment from adhering on the surface of a member exposed to an atmosphere within a processing chamber.

According to one embodiment of the present disclosure, in a film forming apparatus for forming a thin film on a surface of an object to be processed by using an organic metal raw material gas within a processing chamber configured to exhaust air (atmosphere), a hydrophobic layer is installed on a surface of a member exposed to the atmosphere within the processing chamber.

According to one embodiment of the present disclosure, in a film forming apparatus for forming a thin film on a surface of an object to be processed by using an organic metal raw material gas and an oxygen-containing gas within a processing chamber configured to exhaust air, a hydrophobic layer is installed on a surface of a member exposed to the atmosphere within the processing chamber.

According to one embodiment of the present disclosure, in a film forming method for forming a thin film on a surface of an object to be processed by using an organic metal raw material gas within a processing chamber configured to exhaust air, the method comprises: hydrophobizing a surface of the processing chamber by introducing a hydrophobic gas into the processing chamber without the object to be processed accommodated in the processing chamber; and forming the thin film by introducing the organic metal raw material gas into the processing chamber with the object to be processed accommodated in the processing chamber.

Further, according to one embodiment of the present disclosure, in a film forming method for forming a thin film on a surface of an object to be processed by using an organic metal raw material gas within a processing chamber configured to exhaust air, the method comprises: forming a silicon layer on a surface of a member exposed to the atmosphere within the processing chamber in advance; hydrophobizing a surface of the silicon layer by introducing a hydrophobic gas into the processing chamber without the object to be processed accommodated in the processing chamber; and forming the thin film by introducing the organic metal raw material gas into the processing chamber with the object to be processed accommodated in the processing chamber.

BRIEF DESCRIPTION OF THE DRAWINGS

The accompanying drawings, which are incorporated in and constitute a part of the specification, illustrate embodi

DETAILED DESCRIPTION

Figure 1:
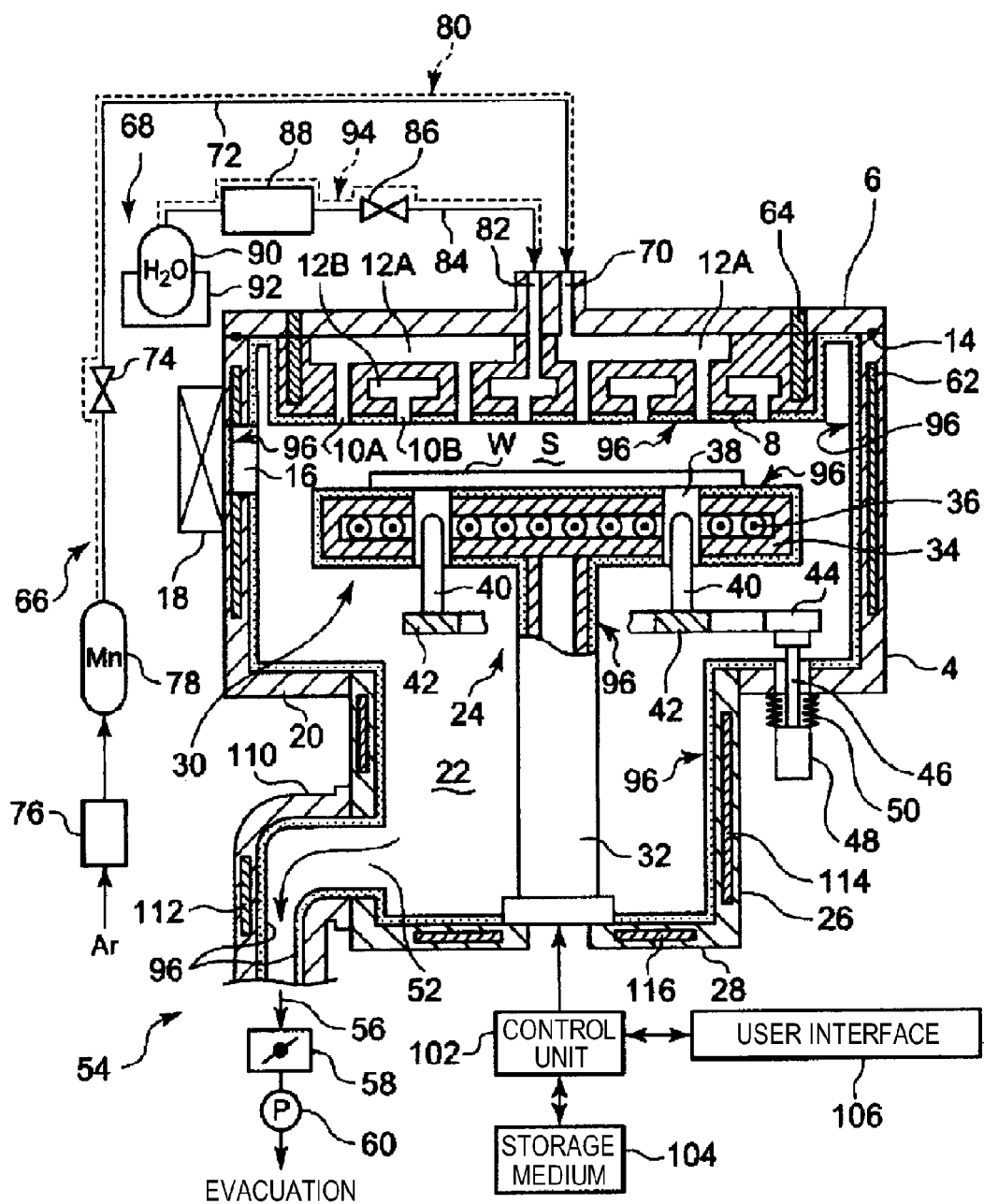
- FIG. 1 is a view illustrating the configuration of one example of a device for forming a film according to the present disclosure.
Figure 2:
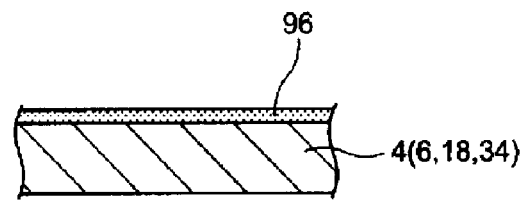
FIG. 2 is a partial enlarged sectional view showing a hydrophobic layer formed on a surface of each member of the film forming device.

Hereinafter, one example of a film forming device and a film forming method according to the present disclosure will be described with reference to the accompanying drawings. FIG. 1 is a view illustrating the configuration of one example of a device for forming a film according to the present disclosure, FIG. 2 is a partial enlarged sectional view showing a hydrophobic layer formed on a surface of each member of the film forming device of FIG. 1, and FIG. 3 is a view showing a process of one example of hydrophobic processing. The film forming device is a device for forming an Mn-containing film as a thin film by using an organic metal gas and an oxygen-containing gas. Also, in the following description, a case in which water vapor ($H_2O$) is used as an oxygen-containing gas will be taken as an example.

As illustrated, a film forming device 2 according to the present embodiment includes a processing chamber 4 which is made of, for example, an aluminum material or an aluminum alloy material, and an internal section of which has a substantially circular shape. A shower head unit 6, as a gas introduction unit for introducing required gas, e.g., a film formation gas, or the like is installed at the ceiling portion of the processing chamber 4. Various gases required for forming a film are sprayed toward a processing space S from a plurality of gas injection holes 10A and 10B installed on a gas injection face 8 of a lower portion thereof.

Two demarcated hollow gas diffusion spaces 12A and 12B are formed within the shower head unit 6. A processing gas introduced into the respective gas diffusion spaces 12A and 12B is diffused in a planar direction and then exhausted from the respective gas injection holes 10A and 10B in communication with the respective gas diffusion spaces 12A and 12B. Namely, the gas injection holes 10A and 10B are disposed in a matrix form, and respective gases sprayed from the respective gas injection holes 10A and 10B are mixed in the processing space S.

This type of gas supply is called a post-mix. The entirety of the shower head unit 6 is made of, for example, nickel, a nickel alloy such as Hastelloy® or the like, aluminum, or an aluminum alloy. If a film is formed through ALD to be described later, a structural aspect in which only one gas diffusion space is provided in the shower head unit 6 may be employed. A sealing member 14 configured as, for example, an O ring or the like may be interposed at a connection portion between the shower head unit 6 and an upper opening portion of the processing chamber 4 to maintain air-tightness of the interior of the processing chamber 4.

Also, an entrance/exit 16 for allowing a semiconductor wafer W, as an object to be processed, to be carried in or out of the processing chamber 4 therethrough is formed at a side wall of the processing chamber 4. A gate valve 18 is installed on the entrance/exit 16 so as to be opened and closed airtightly.

Further, an exhaust space 22 is formed at a lower portion 20 of the processing chamber 4. More specifically, a large opening 24 is formed at a central portion of the lower portion 20 of the chamber, and a cylindrical partition wall 26 which has a bottom of a cylindrical shape and extends downward is connected to the corresponding opening 24 and the interior of the cylindrical partition wall 26 forms (demarcates) the exhaust space 22. A mounting table structure 30 is installed on a bottom portion 28 of the cylindrical partition wall 26 such that it stands up on the bottom portion 28. Specifically, the mounting table structure 30 is configured to mainly include a cylindrical support 32 standing up on the bottom portion 28 and a mounting table 34 fixed to an upper end portion of the support 32 and allowing the semiconductor wafer W, an object to be processed, to be mounted on an upper surface thereof.

The mounting table 34 is made of, for example, a ceramic material, quartz glass, or aluminum (also including an aluminum alloy). A resistance heater 36 configured as, for example, a carbon wire heater, or the like for generating heat through electrical connection is contained as a heating unit in the mounting table 34. Accordingly, the semiconductor wafer W mounted on the upper surface of the mounting table 34 can be heated.

A plurality of, e.g., three, pin insertion holes 38 are formed in a penetrative manner in a vertical direction in the mounting table 34 (only two pin insertion holes are illustrated in FIG. 1). Push-up pins 40 are disposed in the respective insertion holes 38 in a state that they are inserted so as to be movable up and down. Push-up rings 42 made of, for example, a ceramic material such as alumina, and having a circular ring shape are disposed at lower ends of the push-up pins 40, respectively. Namely, the lower ends of the respective push-up pins 40 are supported by the push-up rings 42. An arm portion 44 extending from the push-up ring 42 is connected to an appearance/disappearance rod 46 installed to penetrate the bottom portion 20 of the chamber. The appearance/disappearance rod 46 is lifted and lowered by an actuator 48.

Accordingly, when the wafer W is carried in or out, the respective push-up pins 40 can be protruded from upper ends of the respective pin insertion holes 38 to an upper side or retreated therefrom. Also, a retractable bellows 50 is installed in a through portion of the bottom portion of the chamber of the appearance/disappearance rod 46, and the appearance/disappearance rod 46 can ascend or descend while maintaining air-tightness in the interior of the processing chamber 4.

The opening 24 at the entrance of the exhaust space 22 is configured to be smaller than the diameter of the mounting table 34, and a gas flowing at an outer side of a circumferential portion of the mounting table 34 moves to a lower side of the mounting table 34 and then flows to the opening 24. Also, an exhaust port 52 is formed on a lower side wall of the cylindrical partition wall 26 such that it faces the exhaust space 22. A vacuum exhaust system 54 is connected to the exhaust port 52. The vacuum exhaust system 54 has an exhaust passage 56 formed by an exhaust pipe 110 connected to the exhaust port 52, and a pressure regulation valve 58, a vacuum pump 60, an abatement device (not shown), and the like are sequentially installed in the exhaust passage 56. Accordingly, air can be exhausted by controlling the pressure of the atmosphere in the processing chamber 4 and the exhaust space 22. And, a rubber heater 112, or the like is wound on the exhaust pipe 110 to perform heating at a certain temperature.

Further, heating units, e.g., cartridge heaters 62, 64, 114, and 116 are buried in a side wall of the processing chamber 4, a side wall of the shower head unit 6, a side wall of the cylindrical partition wall 26, and the bottom portion 28 of the cylindrical partition wall 26 in order to maintain a raw material gas at a certain temperature, e.g., at 80 degrees C., to prevent the raw material gas from being re-liquefied.

Also, a raw material gas supply unit 66 for supplying a raw material gas and an oxygen-containing gas supply unit 68 for supplying an oxygen-containing gas, e.g., water vapor ($H_2O$), are connected to the shower head unit 6 in order to supply a certain gas to the shower head unit 6.

The raw material gas supply unit 66 has a raw material gas flow path 72 connected to a gas entrance 70 of the gas diffusion space 12A in one direction among two gas diffusion spaces. A switching valve 74 is installed at a midway point of the raw material gas flow path 72, and the raw material gas flow path 72 is connected to a first raw material source 78 for containing a first raw material by way of the switching valve 74. Also, a flow rate controller 76 such as a mass flow controller is installed on the raw material gas flow path 72 at an upper stream side of the first raw material source 78 in order to regulate a flow rate of a bubbling gas.

As a first raw material, an organic metal raw material including metal is used. For example, a raw material gas may be bubbled by an inert gas, such as a flow rate-controlled Ar gas, or the like so as to be gasified, whereby the organic metal raw material may be supplied along with the inert gas. Here, when a vapor pressure of the raw material is low, the first raw material source 78 is heated by a heater (not shown), or the like in order to increase the vapor pressure of the raw material. As the organic metal raw material, for example, $(EtCp)_2Mn$ (precursor: cyclopentadienylmanganese) including manganese is stored in a liquid state in the first raw material source 78. Also, a rare gas such as He, Ne, or the like, or $N_2$ or $H_2$, instead of Ar gas, may be used as the inert gas for bubbling.

Further, a tape heater 80 is wound around the raw material gas flow path 72 or the switching valve 74 installed at the raw material gas flow path 72 in order to prevent the raw material gas from being re-liquefied, and these are heated at, for example, 80 degrees C. Also, of course, a plurality of raw material gas supply units may be installed depending on a raw material in use.

The oxygen-containing gas supply unit 68 includes a gas flow path 84 connected to a gas entrance 82 of the other gas diffusion space 12B. A switching valve 86 and a flow rate controller 88 such as a mass flow controller are sequentially installed in the midway points of the gas flow path 84, connecting the gas flow path 84 to a water vapor source 90 for generating water vapor. The water vapor source 90 may be configured as, for example, a water tank. The water tank may be maintained at, for example, about 40 degrees C., by, for example, a temperature regulator 92, and generates water vapor by increasing a vapor pressure.

Also, a tape heater 94 is wound around the flow rate controller 88 without the gas flow path 84 and the switching valve 86 installed at the gas flow path 84, in order to prevent water vapor from being re-liquefied, and these are heated at, for example, 80 degrees C.

In the present embodiment, the raw material gas is introduced into the gas diffusion space 12A positioned at an upper side of the shower head unit 6, and the oxygen-containing gas (water vapor) is introduced into the gas diffusion space 12B positioned at a lower side of the shower head unit 6. This is because, since the shower head unit 6 is in proximity to the mounting table 34, the temperature of the gas injection face 8 is increased. Namely, if the raw material gas is introduced into the lower gas diffusion space 12B, the raw material gas would likely decompose.

Also, although not shown, a purging inert gas supply unit is connected to the shower head unit 6, and a purging gas may be supplied as necessary. As the purging gas, an inert gas such as $N_2$ gas, Ar gas, He gas, Ne gas, or the like may be used. And, a hydrophobic layer 96, which is the feature of the present disclosure, is installed on the surfaces of members exposed to the atmosphere within the processing chamber 4.

More specifically, in the present embodiment, the members include the processing chamber 4, the shower head unit 6, the mounting table structure 30, the gate valve 18, and the like. Namely, they include the inner surface of the processing chamber 4 (also including the inner surface of the cylindrical partition wall 26), the lower surface of the shower head unit 6, respective surfaces of the mounting table 34, respective surfaces of the support 32, the inner surface of the gate valve 18, and the like, and the surfaces directly exposed to the atmosphere within the processing chamber 4. And the hydrophobic layer 96 is installed on those surfaces. The situation in this case is shown in FIG. 2. Namely, the hydrophobic layer 96 is installed on the surfaces of the respective members represented by the processing chamber 4, and the like. The surface of the hydrophobic layer 96 is hydrophobic. Thus, adhesion of sediment on the respective surfaces of the hydrophobic layer 96 is suppressed. Also, in this case, in order to sufficiently exert the sediment adhesion suppression effects, the hydrophobic layer 96 may be formed on at least the inner surface of the processing chamber 4. In addition, the hydrophobic layer 96 is preferably installed on an inner surface of the exhaust pipe 110 connected to the processing chamber 4, or the inner wall or an inner structure of the pressure regulation valve 58 and the vacuum pump 60.

As the hydrophobic layer 96, specifically, an SiOC layer, a fluorinated resin layer, a lubricated alumite or hydrophobic heat-resistant paint, or a hydrophobized silicon layer may be used. Such hydrophobic layer 96 is formed to have a thickness ranging, for example, from 0.01 to 5 mm. In the SiOC layer, the SiOC material itself is hydrophobic. As the SiOC layer, an SiOC material having a dense interior, or an SiOC material being porous therein may be used. In one example, as the SiOC layer, Black Diamond®, Aurora ULK®, or the like may be used. Also, in the fluorinated resin layer, the fluorinated resin material itself is hydrophobic. As the fluorinated resin layer, for example, Teflon® may be used. Also, the lubricated alumite is formed by charging (filling) fatty acid such as oleic acid or the like, graphite, or a Teflon resin (fluorinated resin) in fine pores of a hard alumite coated film, and it also includes an alumite obtained by adsorbing fine particles of poly tetrafluoreethylene (PTFE).

Figure 3A:
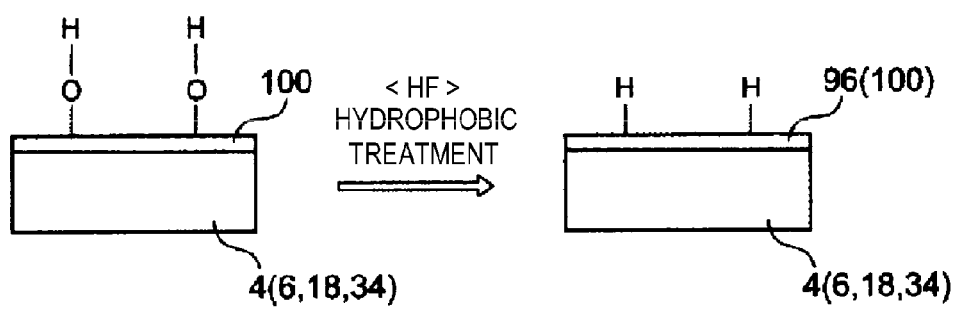
FIGS. 3A and 3B are views showing a process of one example of hydrophobic processing.
Figure 3B:
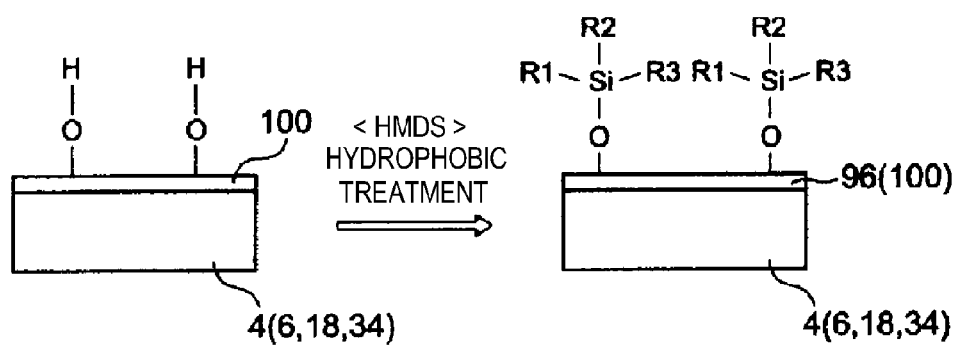

Also, the silicon layer is formed on the surfaces of the respective members of the processing chamber 4, or the like by a silicon thermal spray process, for example. In this case, as shown in FIGS. 3A and 3B, the surface of the silicon layer 100 is terminated with an —OH group which is a hydrophilic group, so hydrophobization (or hydrophobic treatment) is performed on the surface of the silicon layer 100 to make the surface hydrophobic, thus forming the hydrophobic layer 96. Examples of the hydrophobization may include a method for HF-cleansing the surface of the silicon layer 100 as shown in FIG. 3A and a method of processing the surface of the silicon layer 100 with hexamethyldisilazane (HMDS)[=$(CH_3)_3Si$—NH—$Si(CH_3)_3$] as shown in FIG. 3B. By performing HF cleansing, the —OH group on the surface of the silicon layer 100 is substituted with a —H and hydrogen-terminated as shown in FIG. 3A. Accordingly, hydrophobicity can be exhibited. Or, by performing HMDS, the —OH group on the surface of the silicon layer 100 is reacted with HMDS so as to be silylated and Si and three methyl groups are bonded as shown in FIG. 3B. Accordingly, hydrophobicity can be exhibited. Also, as shown in FIG. 3B, R1, R2, and R3 are not limited to the methyl groups, but they may be alkyl groups.

Preferably, before the film forming device 2 is assembled, i.e., in a state the respective members exist as unassembled parts, the above-mentioned hydrophobic layer 96 is selectively formed on the surfaces which are to be exposed to the atmosphere within the processing chamber 4 after assembling the film forming device 2.

Referring back to FIG. 1, in order to control the overall operation of this device, for example, a control unit 102 configured as a computer, or the like is installed. The control unit 102 controls the initiation and the termination of the supply of respective gases, a supply amount of the respective gases, the pressure within the processing chamber 4, the temperature of the wafer W, and the like. Also, the control unit 102 includes a storage medium 104 for storing a computer program for performing the foregoing control, or a user interface 106. As the storage medium 104, for example, a flexible disk, a flash memory, a hard disk, a compact disc (CD), or the like may be used. The user interface 106 is configured as a keyboard for allowing an operator to input and output a command to manage the film forming device 2, a display for visually displaying an actuation state of the film forming device 2, and the like.

Next, the operation of the film forming device 2 configured as described above will be described. First, the surface of the unprocessed semiconductor wafer W is covered by, for example, an insulating layer such as an interlaying insulating layer or the like, and the semiconductor wafer W has trenches such as a contact hole, a via hole, or a wiring recess, reaching an underlying wiring layer, previously formed therein. Such a wafer W is maintained by a carrying arm (not shown) and carried into the processing chamber 4 through the gate valve 18 in an open state, and the entrance/exit 16. Also, the wafer W is handed over to the lifted push-up pins 40. As the push-up pins 40 are lowered, the wafer W is mounted on an upper surface of the mounting table 34.

Then, the raw material gas supply unit 66 or the oxygen-containing gas supply unit 58 operates, and respective gases, whose flow rates are controlled, are supplied to the shower head unit 6 and sprayed from the gas injection holes 10A and 10B so as to be introduced into the processing space S. Various gas supply aspects exist, as will be described later. Here, an Mn-containing raw material gas and water vapor are supplied.

Also, the vacuum pump 60 installed in the vacuum exhaust system 54 is continuously driven to exhaust air within the processing chamber 4 or the exhaust space 22. And, the degree of opening the pressure regulation valve 58 is adjusted to maintain the atmosphere of the processing space S at a certain processing pressure. At this time, the wafer W is heated by the resistance heater 36 installed in the mounting table 34 and maintained at a certain processing temperature. In this case, the processing temperature of the wafer W is about 200 degrees C. Also, the shower head unit 6 or the processing chamber 4 is heated to have a temperature, e.g., about 80 degrees C., at which the Mn raw material gas is prevented from being re-liquefied.

Accordingly, a desired thin film is formed on the surface of the semiconductor wafer W. In this case, the Mn-containing film is formed as a thin film on the surface of the wafer W. The Mn-containing film may be, specifically, $MnO_x$ film (manganese oxide film), and may be $MnSi_xO_y$ which has been reacted with an underlying base, depending on circumstances.

A gas supply aspect in this case, as in yet another related art, for example, includes a method of forming a thin film through thermal CVD by simultaneously supplying an Mn-containing raw material gas and water vapor, and an atomic layered deposition (ALD) method of repeatedly performing a raw material gas adsorption process and a reaction process by alternately intermittently supplying the Mn-containing raw material gas and water vapor repeatedly. Any supply aspect (film forming method) may be used. In the ALD method, the adsorption of the raw material gas and the reaction by supplying water vapor are alternately performed to stack a thin film having a thickness of an atomic level or a molecular level one by one repeatedly.

In the film forming process as described above, in case of the conventional film forming device, when the Mn-containing raw material gas or water vapor is supplied into the processing chamber, the raw material gas or water vapor tend to be attached to the surfaces of the members exposed to the atmosphere within the processing chamber, e.g., the inner surface of the processing chamber, the gas injection face of the shower head unit, the surface of the mounting table, the inner surface of the gate valve, and the like, and the Mn-containing thin film is unnecessarily deposited thereon.

However, in the film forming device 2 according to the present embodiment, as described above, since the hydrophobic layer 96 is installed on each of the surfaces of the members exposed to the atmosphere within the processing chamber 4, i.e., the inner surface of the processing chamber 4, the gas injection face 8 of the shower head unit 6, the surface of the mounting table structure 30 including the mounting table 34 and the support 32, and the inner surface of the gate valve 18, the Mn-containing raw material gas or water vapor is effectively restrained from being attached to the surfaces of the respective members.

In particular, when a raw material such as $(EtCp)_2Mn$ is used as an Mn-containing raw material, since cyclo pentadienyl (Cp) is aromaticus and has $\pi$ electrons, it is considered difficult for the Mn-containing raw material itself to be adsorbed to the surface of the hydrophobic member. As an Mn raw material having this cyclo pentadienyl ligand, for example, $(EtCp)_2Mn[=Mn(C_2H_5C_5H_4)_2]$, $Cp_2Mn[=Mn(C_5H_5)_2]$, $(MeCp)_2Mn[=Mn(CH_3C_5H_4)_2]$, $(i\text{-}PrCp)_2Mn[=Mn(C_3H_7C_5H_4)_2]$, $MeCpMn(CO)_3[=(CH_3C_5H_4)Mn(CO)_3]$, $(t\text{-}BuCp)_2Mn[=Mn(C_4H_9C_5H_4)_2]$, $Mn(DMPD)(EtCp)[=Mn(C_7H_{11}C_2H_5C_5H_4)]$, $((CH3)_5Cp)_2Mn[=Mn((CH_3)_5C_5H_4)_2$ may be used. Namely, one or more materials selected from the group consisting of these materials may be used. In this case, attachment and deposition of unnecessary sediment on the surfaces of the respective members can be more effectively prevented. Thus, the generation of particles due to delamination of the unnecessary sediment can be considerably restrained. Also, down time of the device according to maintenance such as cleaning, or the like within the processing chamber can be reduced, and operational cost can also be reduced.

Next, an experiment of evaluating the hydrophobic layer 96 used for the film forming device as described above was performed. The results will be described. Here, a chip (small piece) having a surface with materials constituting respective hydrophobic layers formed thereon was installed on the mounting table within the processing chamber, 200 degrees C., as the same processing temperature as that in forming the $MnO_x$ film, was maintained, and the same film forming processing as that of $MnO_x$ film as described was performed for 10 minutes.

Figure 4:
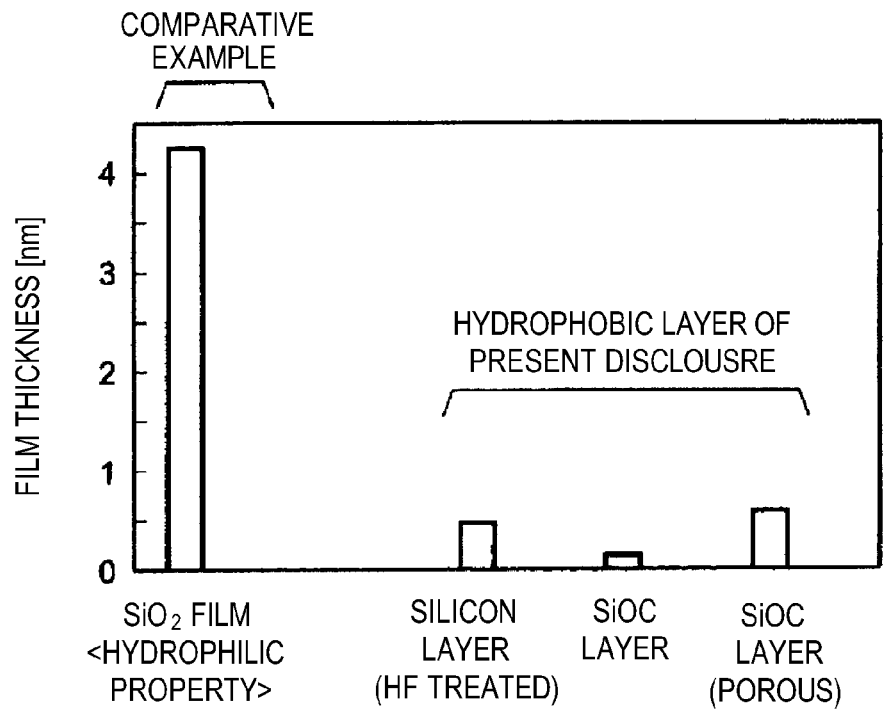
FIG. 4 is a graph showing experiment results of evaluating a film thickness of a film deposited on the hydrophobic layer used in the film forming device of the present disclosure.

Also, for a comparison, the same film forming processing was performed on a chip of an aluminum alloy used as a constituent material of the processing chamber which was not subjected to hydrophobization and a chip having an $SiO_2$ film formed on a surface thereof by using TEOS as a representative of a hydrophilic surface. The results in this case are shown in FIG. 4. FIG. 4 is a graph showing a film thickness of the films deposited on the respective surface layers.

As shown in FIG. 4, the $MnO_x$ film having a thickness of about 4.2 nm is formed to be thick on the surface of the $SiO_2$ film chip which is a hydrophilic surface formed by using TEOS. This is undesirable.

In comparison, in case of using the hydrophobic layer disclosed in the present disclosure, it can be seen that the thickness of the deposited $MnO_x$ film is restrained in every material, so it is very thin. Namely, it can be seen that the film thickness of the chip having the HF-treated (hydrophobized) silicon layer was about 0.5 nm, that of the chip having the SiOC layer (Black Diamond) was about 0.2 nm, and that of the chip having the porous SiOC layer was about 0.6 nm, the results of all of which are good.

In the film forming device 2 according to the present embodiment, before the film forming device 2 is assembled, the hydrophobic layer 96 is formed on the required surfaces of the respective members, but the present disclosure is not limited thereto. For example, when a silicon layer is used as the hydrophobic layer 96, hydrophobization may be performed before forming the Mn-containing film after the film forming device is assembled.

Figure 5:
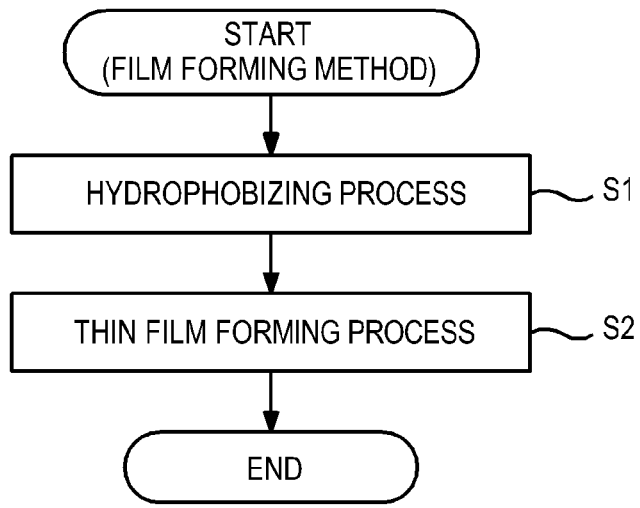
FIG. 5 is a flowchart illustrating one example of a film forming method according to the present disclosure.

FIG. 5 is a flowchart illustrating a process of an example in such a case. More specifically, a hydrophobizing process is performed (S1). Namely, within the processing chamber 4 of the film forming device 2 fabricated by assembling respective members with a silicon layer formed thereon, with the wafer W not accommodated yet, a hydrophobic gas is allowed to flow into the processing chamber 4 from a gas source (not shown), and the surface of the silicon layer formed on the surface of each of the members is hydrophobized. The hydrophobic gas, HF gas or HMDS gas may be used. Accordingly, the surface of the silicon layer formed on the surfaces of the respective members, that is, the inner surface of the processing chamber 4, the gas injection face 8 of the shower head unit 6, the surface of the mounting table structure 30, or the surface of the gate valve 18 is hydrophobized to form the hydrophobic layer 96 as shown in FIG. 3.

Accordingly, as shown in FIG. 1, the hydrophobic layer 96 is formed on each of the surfaces of the respective members. Thereafter, as described above, a thin film forming process is performed (S2). Namely, the Mn-containing raw material gas and water vapor are allowed to flow into the processing chamber 4 to form the $MnO_x$ film. Also in this case, since the hydrophobic layer 96 is formed on the surface of each of the members, the same working effects as that described above can be achieved. Further, the foregoing hydrophobization is performed on the silicon layer attached to the surface of each of the members, but the present disclosure is not limited thereto, and hydrophobization may be performed directly on the respective members without installing the silicon layer on the surface thereof.

In addition, in the foregoing embodiment, the same material is used for the hydrophobic layer 96 of each member, but the present disclosure is not limited thereto and various materials may be separately combined. For example, an SiOC layer may be installed as the hydrophobic layer 96 on the inner surface of the processing chamber 4, and an HF-treated silicon layer may be installed as the hydrophobic layer 96 on the gas injection face 8 of the shower head unit 6.

Also, in the foregoing embodiment, water vapor was used as an oxygen-containing gas as an example, but the present disclosure is not limited thereto, and as the oxygen-containing gas, one or more selected from the group consisting of $H_2O$ (water vapor), $N_2O$, $NO_2$, $NO$, $O_3$, $O_2$, $H_2O_2$, $CO$, $CO_2$, alcohols, and organic acid may be used. The alcohols may include a methyl alcohol, an ethyl alcohol, and the like.

Additionally, in the foregoing embodiment, the Mn-containing raw material gas and the oxygen-containing gas were used and the $MnO_x$ film was used as a thin film as an example, but the present disclosure is not limited thereto. Namely, the present disclosure may also be applicable to a case where the Mn film is formed as a thin film by using the Mn-containing raw material gas, without using the oxygen-containing gas.

Also, in the foregoing embodiment, $(EtCp)_2Mn$ was used as the Mn-containing raw material as an example, but the present disclosure is not limited thereto, and as the Mn-containing raw material, one or more selected from the group consisting of $(EtCp)_2Mn[=Mn(C_2H_5C_5H_4)_2]$, $Cp_2Mn[=Mn(C_5H_5)_2]$, $(MeCp)_2Mn[=Mn(CH_3C_5H_4)_2]$, $(i\text{-}PrCp)_2Mn[=Mn(C_3H_7C_5H_4)_2]$, $MeCpMn(CO)_3[=(CH_3C_5H_4)Mn(CO)_3]$, $(t\text{-}BuCp)_2Mn[=Mn(C_4H_9C_5H_4)_2]$, $CH_3Mn(CO)_5$, $Mn(DPM)_3[=Mn(C_{11}H_{19}O_2)_3]$, $Mn(DMPD)(EtCp)[=Mn(C_7H_{11}C_2H_5C_5H_4)]$, $Mn(acac)_2[=Mn(C_5H_7O_2)_2]$, $Mn(DPM)_2[=Mn(C_{11}H_{19}O_2)_2]$, $Mn(acac)_3[=Mn(C_5H_7O_2)_3]$, $Mn(hfac)_2[=Mn(C_5HF_6O_2)_3]$, $((CH_3)_5Cp)_2Mn[=Mn((CH_3)_5C_5H_4)_2]$, $[Mn(iPr\text{-}AMD)_2][=Mn(C_3H_7NC(CH_3)NC_3H_7)_2]$, and $[Mn(tBu\text{-}AMD)_2][=Mn(C_4H_9NC(CH_3)NC_4H_9)_2]$ may be used.

Further, in the foregoing embodiment, Mn was taken as an example of metal included in the organic metal raw material gas, but the present disclosure is not limited thereto. As the metal included in the organic metal raw material gas, one or more selected from the group consisting of Mn, Nb, Zr, Cr, V, Y, Pd, Ni, Pt, Rh, Tc, Al, Mg, Sn, Ge, Ti, and Re may be used.

Also, in the foregoing embodiment, HF gas or HMDS gas was taken as an example of the hydrophobic gas, but the present disclosure is not limited thereto. As the hydrophobic gas, one or more gases selected from the group consisting of HF, HMDS(Hexamethyldisilazane), TMDS(1,1,3,3-Tetramethyldisilazane), TMSDMA(Dimethylaminotrimethylsilane), DMSDMA(Dimethylsilyldimethylamine), TMMAS(Trimethylmethylaminosilane), TMICS(Trimethyl(isocyanato)silane), TMSA(Trimethylsilylacetylene), and TMSC(Trimethylsilylcyanide5), 1,3,5,7-tetramethylcyclotetrasiloxane, dimethylsilane, tetraethylcyclotetrasilosane, 1,2,3-triethyl-2,4,6-trimethylcyclotrisilazane, 1,2,3,4,5,6-hexamethylcyclotrisilazane, monomethylsilane, hexamethyldisilane, hexamethylsiloxane, trimethylsilane, tetramethylsilane, dimethyldimethoxysilane, octamethylcyclotetrasiloxane, trimethoxymethylsilane, hexaethyldisilazane, hexaphenyldisilazane, heptamethyldisilazane, dipropyl-tetramethyldisalazane, di-n-butyl-tetramethyldisilazane, di-n-octyl-tetramethyldisilazane, divinyl-tetramethyldisilazane, 1,1,3,3,5,5-hexamethylcyclotrisilazane, hexaethylcyclotrisilazane, hexaphenylcyclotrisilazane, octamethylcyclotrisilazane, octaethylcyclotrisilazane, tetraethyltetramethylcyclotrisilazane, tetraphenyldimethyldisilazane, diphenyl-tetramethyldisilazane, trivinyl-trimethylcyclotrisilazane, and tetravinyl-tetramethylcyclotetrasilazane may be used.

According to the present disclosure in some embodiments, since the hydrophobic layer is installed on the surface of the member exposed to the atmosphere within the processing chamber, the attachment of sediment on the surfaces of the member can be effectively restrained.

Furthermore, the semiconductor wafer is described here as an example of the object to be processed, but the semiconductor wafer includes a silicon substrate or a compound semiconductor substrate such as GaAs, SiC, GaN, or the like. Also, without being limited thereto, the present disclosure may also be applicable to a glass substrate, a ceramic substrate, or the like used for a liquid crystal display device.

What is claimed is:

1. A film forming method for forming a thin film on a surface of an object to be processed by using an organic metal raw material gas within a processing chamber configured to exhaust air, the method comprising:

hydrophobizing a surface of the processing chamber by introducing a hydrophobic gas into the processing chamber without the object to be processed accommodated in the processing chamber; and forming the thin film by introducing the organic metal raw material gas into the processing chamber with the object to be processed accommodated in the processing chamber.

2. A film forming method for forming a thin film on a surface of an object to be processed by using an organic metal raw material gas within a processing chamber configured to exhaust air, the method comprising:

forming a silicon layer on a surface of a member exposed to the atmosphere within the processing chamber in advance;

hydrophobizing a surface of the silicon layer by introducing a hydrophobic gas into the processing chamber without the object to be processed accommodated in the processing chamber; and forming the thin film by introducing the organic metal raw material gas into the processing chamber with the object to be processed accommodated in the processing chamber.

3. The method of claim 1, wherein the hydrophobic gas is configured as one or more gases selected from the group consisting of HF, HMDS(Hexamethyldisilazane), TMDS(1,1,3,3-Tetramethyldisilazane), TMSDMA(Dimethylaminotrimethylsilane), DMSDMA(Dimethylsilyldimethylamine), TMMAS(Trimethylmethylaminosilane), TMICS(Trimethyl(isocyanato)silane), TMSA(Trimethylsilylacetylene), and TMSC(Trimethylsilylcyanide5), 1,3,5,7-tetramethylcyclotetrasiloxane, dimethylsilane, tetraethylcyclotetrasilosane, 1,2,3-triethyl-2,4,6-trimethylcyclotrisilazane, 1,2,3,4,5,6-hexamethylcyclotrisilazane, monomethylsilane, hexamethyldisilane, hexamethylsiloxane, trimethylsilane, tetramethylsilane, dimethyldimethoxysilane, octamethylcyclotetrasiloxane, trimethoxymethylsilane, hexaethyldisilazane, hexaphenyldisilazane, heptamethyldisilazane, dipropyl-tetramethyldisalazane, di-n-butyl-tetramethyldisilazane, di-n-octyl-tetramethyldisilazane, divinyl-tetramethyldisilazane, 1,1,3,3,5,5-hexamethylcyclotrisilazane, hexaethylcyclotrisilazane, hexaphenylcyclotrisilazane, octamethylcyclotrisilazane, octaethylcyclotrisilazane, tetraethyltetramethylcyclotrisilazane, tetraphenyldimethyldisilazane, diphenyl-tetramethyldisilazane, trivinyl-trimethylcyclotrisilazane, and tetravinyl-tetramethylcyclotetrasilazane.

* * * * *